US009236564B2

(12) United States Patent
Carey et al.

(10) Patent No.: US 9,236,564 B2
(45) Date of Patent: Jan. 12, 2016

(54) METHOD AND SYSTEM FOR PROVIDING AN ENGINEERED MAGNETIC LAYER INCLUDING HEUSLER LAYERS AND AN AMORPHOUS INSERTION LAYER

(71) Applicant: Samsung Electronics Co., LTD., Gyeonggi-do (KR)

(72) Inventors: Matthew J. Carey, San Jose, CA (US); Keith Chan, San Jose, CA (US); Roman Chepulskyy, Milpitas, CA (US)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 0 days.

(21) Appl. No.: 14/478,963

(22) Filed: Sep. 5, 2014

(65) Prior Publication Data

US 2015/0162378 A1    Jun. 11, 2015

Related U.S. Application Data

(60) Provisional application No. 61/914,875, filed on Dec. 11, 2013.

(51) Int. Cl.
| | |
|---|---|
| *H01L 43/02* | (2006.01) |
| *G11B 5/39* | (2006.01) |
| *H01L 43/12* | (2006.01) |
| *H01L 43/10* | (2006.01) |

(52) U.S. Cl.
CPC ............ *H01L 43/12* (2013.01); *H01L 43/02* (2013.01); *H01L 43/10* (2013.01); *G11B 5/3909* (2013.01); *G11B 2005/3996* (2013.01)

(58) Field of Classification Search
None
See application file for complete search history.

(56) References Cited

U.S. PATENT DOCUMENTS

| | | | |
|---|---|---|---|
| 7,672,088 B2 | 3/2010 | Zhang et al. | |
| 7,881,024 B2 | 2/2011 | Ide et al. | |
| 7,973,351 B2 | 7/2011 | Marukame et al. | |
| 7,991,926 B1 | 8/2011 | Arad | |
| 8,059,374 B2 | 11/2011 | Zhao et al. | |
| 8,064,244 B2 | 11/2011 | Zhang et al. | |

(Continued)

OTHER PUBLICATIONS

Kevin Lim, Jichuan Chang, Trevor Mudge, Parthasarathy Ranganathan, Steven K. Reinhard, Thomas F. Wenisch, "Disaggregated Memory for Expansion and Sharing in Blade Servers," ISCA'09, Jun. 20-24, 2009, Austin, TX. ACM 978-1-60558-526-0/09/06, 12 pages.

(Continued)

*Primary Examiner* — Craig A. Renner
(74) *Attorney, Agent, or Firm* — Convergent Law Group LLP

(57) ABSTRACT

A magnetic junction usable in a magnetic device and a method for providing the magnetic junction are described. The magnetic junction includes a free layer, a pinned layer and nonmagnetic spacer layer between the free and pinned layers. At least one of the free and pinned layers includes at least one engineered Heusler structure having a first magnetic layer, a second magnetic layer and an amorphous layer between the magnetic layers. At least one of the first and second magnetic layer(s) is a Heusler layer. The first magnetic layer's perpendicular magnetic anisotropy energy (PMAE) exceeds is out-of-plane demagnetization energy. The second magnetic layer's PMAE exceeds its out-of-plane demagnetization energy. The free layer and/or the pinned layer has a PMAE greater than an out-of-plane demagnetization energy. The free layer is switchable between stable magnetic states when a write current is passed through the magnetic junction.

23 Claims, 6 Drawing Sheets

(56) References Cited

U.S. PATENT DOCUMENTS

| | | |
|---|---|---|
| 8,209,465 B2 | 6/2012 | Oribe et al. |
| 8,218,355 B2 | 7/2012 | Kitagawa et al. |
| 8,259,420 B2 | 9/2012 | Zhao et al. |
| 8,320,232 B1 | 11/2012 | Marinero et al. |
| 8,335,059 B2 | 12/2012 | Ishikawa et al. |
| 8,357,962 B2 | 1/2013 | Marukame et al. |
| 8,363,462 B2 | 1/2013 | Nagase et al. |
| 8,458,431 B2 | 6/2013 | Hepkin et al. |
| 8,467,154 B2 | 6/2013 | Covington et al. |
| 8,488,373 B2 | 7/2013 | Zhang et al. |
| 8,502,331 B2 | 8/2013 | Kitagawa et al. |
| 8,551,626 B2 | 10/2013 | He et al. |
| 8,553,450 B2 | 10/2013 | Hosotani et al. |
| 2009/0113119 A1 | 4/2009 | Oribe et al. |
| 2010/0036994 A1 | 2/2010 | Resnick |
| 2011/0145463 A1 | 6/2011 | Jeddeloh |
| 2011/0149647 A1 | 6/2011 | Kim et al. |
| 2011/0271014 A1 | 11/2011 | Turner et al. |
| 2012/0088125 A1 | 4/2012 | Nishiyama et al. |
| 2013/0001713 A1 | 1/2013 | Ueda et al. |
| 2013/0054817 A1 | 2/2013 | Moen et al. |
| 2013/0132505 A1 | 5/2013 | Morris |
| 2013/0132587 A1 | 5/2013 | Morris |
| 2013/0221461 A1 | 8/2013 | Sukegawa et al. |
| 2013/0236639 A1 | 9/2013 | Carey et al. |
| 2013/0236744 A1 | 9/2013 | Brinkman et al. |
| 2013/0242435 A1 | 9/2013 | Fuji et al. |

OTHER PUBLICATIONS

G. Ortiz, A. Garcia-Garcia, N. Biziere, F. Boust, J. F. Bobo, and E. Snoeck, "Growth, structural, and magnetic characterization of epitaxial Co2MnSi films deposited on MgO and Cr seed layers," Journal of Applied Physics, vol. 113, 043921, Jan. 2013. DOI: 10.1063/1.4789801, pp. 1-7.

METHOD AND SYSTEM FOR PROVIDING AN ENGINEERED MAGNETIC LAYER INCLUDING HEUSLER LAYERS AND AN AMORPHOUS INSERTION LAYER

CROSS-REFERENCE TO RELATED APPLICATIONS

This application claims the benefit of provisional Patent Application Ser. No. 61/914,875, filed Dec. 11, 2013, entitled AMORPHOUS INSERTION LAYER BETWEEN HEUSLER LAYER AND CRYSTALLINE UNDERLAYER, assigned to the assignee of the present application, and incorporated herein by reference.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-MRAM). STT-MRAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, FIG. 1 depicts a conventional magnetic tunneling junction (MTJ) 10 as it may be used in a conventional STT-MRAM. The conventional MTJ 10 typically resides on a substrate 12. A bottom contact 14 and top contact 22 may be used to drive current through the conventional MTJ 10. The conventional MTJ, uses conventional seed layer(s) (not shown), may include capping layers (not shown) and may include a conventional antiferromagnetic (AFM) layer (not shown). The conventional magnetic junction 10 includes a conventional pinned layer 16, a conventional tunneling barrier layer 18, and a conventional free layer 20. Also shown is top contact 22. Conventional contacts 14 and 22 are used in driving the current in a current-perpendicular-to-plane (CPP) direction, or along the z-axis as shown in FIG. 1. Typically, the conventional pinned layer 16 is closest to the substrate 12 of the layers 16, 18 and 20.

The conventional pinned layer 16 and the conventional free layer 20 are magnetic. The magnetization 17 of the conventional pinned layer 16 is fixed, or pinned, in a particular direction. Although depicted as a simple (single) layer, the conventional pinned layer 16 may include multiple layers. For example, the conventional pinned layer 16 may be a synthetic antiferromagnetic (SAF) layer including magnetic layers antiferromagnetically coupled through thin conductive layers, such as Ru. In such a SAF, multiple magnetic layers interleaved with a thin layer of Ru may be used. In another embodiment, the coupling across the Ru layers can be ferromagnetic.

The conventional free layer 20 has a changeable magnetization 21. Although depicted as a simple layer, the conventional free layer 20 may also include multiple layers. For example, the conventional free layer 20 may be a synthetic layer including magnetic layers antiferromagnetically or ferromagnetically coupled through thin conductive layers, such as Ru. Although shown as perpendicular-to-plane, the magnetization 21 of the conventional free layer 20 may be in plane. Thus, the pinned layer 16 and free layer 20 may have their magnetizations 17 and 21, respectively oriented perpendicular to the plane of the layers.

Because of their potential for use in a variety of applications, research in magnetic memories is ongoing to improve the performance of the STT-RAM. For example, in order to achieve perpendicular magnetic moments 17 and 21, various structures have been proposed. However, such structures may suffer from higher damping (which increases the required switching current), a lower magnetoresistance that decreases the signal and/or other issues. Accordingly, what is needed is a method and system that may improve the performance of the spin transfer torque based memories. The method and system described herein address such a need.

BRIEF SUMMARY OF THE INVENTION

A magnetic junction usable in a magnetic device and a method for providing the magnetic junction are described. The magnetic junction includes a free layer, a pinned layer and nonmagnetic spacer layer between the free and pinned layers. At least one of the free and pinned layers includes at least one engineered Heusler structure. Each engineered Heusler structure has a first magnetic layer and a second magnetic layer, at least one of which is a Heusler layer, and an amorphous layer between the first and second magnetic layers. The first magnetic layer has a first perpendicular magnetic anisotropy energy and a first out-of-plane demagnetization energy. The first perpendicular magnetic anisotropy energy exceeds the first out-of-plane demagnetization energy. The second magnetic layer has a second perpendicular magnetic anisotropy energy and a second out-of-plane demagnetization energy. The second perpendicular magnetic anisotropy energy exceeds the second out-of-plane demagnetization energy. At least one of the free layer and the pinned layer has a perpendicular magnetic anisotropy energy greater than an out-of-plane demagnetization energy. The magnetic junction is configured such that the free layer is switchable between a plurality of stable magnetic states when a write current is passed through the magnetic junction.

DETAILED DESCRIPTION OF THE INVENTION

Figure 1:
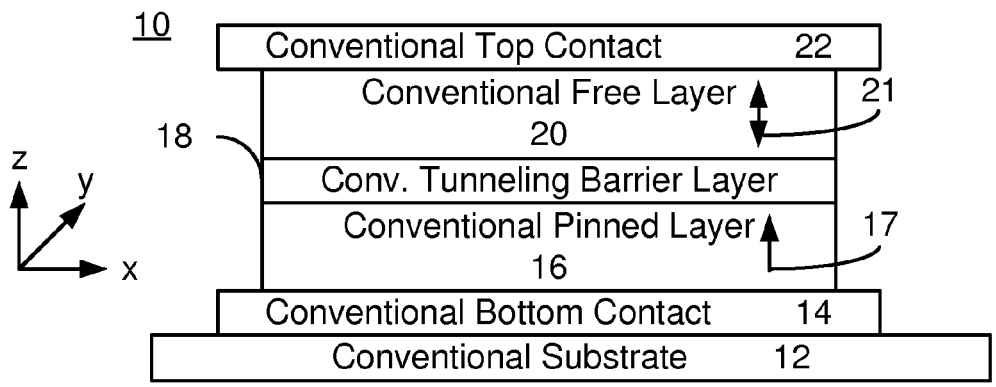
FIG. 1 depicts a conventional magnetic junction.

The exemplary embodiments relate to magnetic junctions usable in magnetic devices, such as magnetic memories, and the devices using such magnetic junctions. The magnetic memories may include spin transfer torque magnetic random access memories (STT-MRAMs) and may be used in electronic devices employing nonvolatile memory. Such electronic devices include but are not limited to cellular phones, smart phones, tables, laptops and other portable and non-portable computing devices. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

The exemplary embodiments are described in the context of particular methods, magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomena. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. As used herein, "in-plane" is substantially within or parallel to the plane of one or more of the layers of a magnetic junction. Conversely, "perpendicular" and "perpendicular-to-plane" corresponds to a direction that is substantially perpendicular to one or more of the layers of the magnetic junction.

A magnetic junction usable in a magnetic device and a method for providing the magnetic junction are described. The magnetic junction includes a free layer, a pinned layer and nonmagnetic spacer layer between the free and pinned layers. At least one of the free and pinned layers includes at least one engineered Heusler structure. Each of the engineered Heusler structure(s) has a first magnetic layer and a second magnetic layer, at least one of which is a Heusler layer, and an amorphous layer between the first and second magnetic layers. The first magnetic layer has a first perpendicular magnetic anisotropy energy and a first out-of-plane demagnetization energy. The first perpendicular magnetic anisotropy energy exceeds the first out-of-plane demagnetization energy. The second magnetic layer has a second perpendicular magnetic anisotropy energy and a second out-of-plane demagnetization energy. The second perpendicular magnetic anisotropy energy exceeds the second out-of-plane demagnetization energy. At least one of the free layer and the pinned layer has a perpendicular magnetic anisotropy energy greater than an out-of-plane demagnetization energy. The magnetic junction is configured such that the free layer is switchable between a plurality of stable magnetic states when a write current is passed through the magnetic junction.

Figure 2:
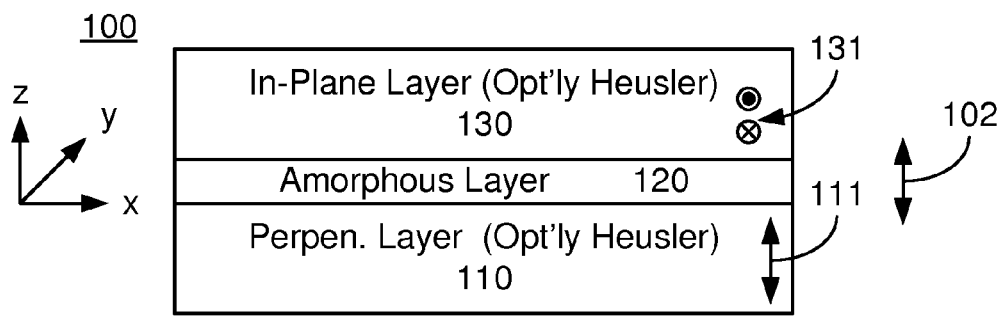
FIG. 2 depicts an exemplary embodiment of an engineered Heusler structure.

FIG. 2 depicts an exemplary embodiment of an engineered Heusler structure 100. For clarity, FIG. 2 is not to scale and seed layer(s) on which the engineered Heusler structure 100 may be grown are not depicted. The engineered Heusler structure 100 is usable in a magnetic layer of a magnetic junction. For example, the Heusler structure 100 may be used in a free layer and/or a pinned layer of a magnetic junction. In some embodiments, multiple Heusler structures 100 may be used in a single free layer and/or a single pinned layer.

The engineered Heusler structure 100 includes a magnetic layer 110, a magnetic layer 130 and an amorphous layer 120 that is sandwiched between the magnetic layer 110 and the magnetic layer 130. At least one of the magnetic layers 110 and 130 is a Heusler layer. Thus, in some embodiments, only the magnetic layer 110 includes or consists of a Heusler alloy. In other embodiments, only the magnetic layer 130 includes or consists of a Heusler alloy. In still other embodiments, both the magnetic layer 110 and the magnetic layer 130 are Heusler layers.

The magnetic layer 110 has a perpendicular magnetic anisotropy energy that exceeds its out-of-plane demagnetization energy. In some embodiments, the perpendicular magnetic anisotropy energy may be significantly larger than the out-of-plane demagnetization energy. Thus, the magnetic layer 110 may have its easy axis 111 perpendicular-to-plane (along the z-axis as shown). Thus, the magnetic layer 110 may also be termed a perpendicular magnetic layer because of its high perpendicular magnetic anisotropy. In some embodiments, the magnetic layer 110 may be a Heusler layer, while in other embodiments, the magnetic layer 110 may be another type of layer. In some embodiments, the perpendicular magnetic layer has a $D0_{22}$ structure. For example, the perpendicular magnetic layer 110 may include $Mn_{3-x}Y$, where Y is selected from Ge, Sn, Ga, Al and Si. In some embodiments the composition of $Mn_{3-x}Y$, where Y is selected from Ge, Sn, Ga, Al and Si, may range from 65 to 85 atomic percent Mn. In some embodiments, the perpendicular magnetic layer 110 may include an $L1_0$ structured alloy. For example, such a perpendicular magnetic layer 110 may include FePt and/or GaMn. In a further embodiment, the perpendicular magnetic layer 110 may include an $L1_0$ $_{or}$ $L1_1$ structured alloy, for example, such a perpendicular magnetic layer 110 may include FePt, FePd, CoPt, CoPd, MnAl, GaMn, and others. In the case of $L1_0$ $_{or}$ $L1_1$ structured FePt, FePd, CoPt, and CoPd the composition may range from 40 to 60 atomic percent of the magnetic element (i.e. Fe or Co). In some embodiments the perpendicular magnetic material may be a [CoX/Y]n multilayer, where X is a transition metal such as Fe, Ni, or Cr, Y is Pt or Pd, and n is the number of repeats which is at least 1. In some embodiments, the perpendicular magnetic material may be a Co alloy such as $Co_3Pt$, $CoPt_3$, $CoCr_8Pt_{22}$, or others. In some embodiments, the perpendicular magnetic material may be a rare-earth transition-metal alloy such as $SmCo_5$, $Fe_{14}Nd_2B$, or others. In some embodiments, the perpendicular magnetic layer 110 is composed only of the perpendicular magnetic material. For example, the perpendicular magnetic layer 110 may consist of only $Mn_{3-x}Y$ or only FePt. However, in other embodiments, the perpendicular magnetic layer 110 may include multiple sublayers and/or multiple materials. In some embodiments, each sublayer is a perpendicular magnetic alloy. In other embodiments, the sublayers may include other layers such as other materials having a perpendicular-to-plane easy axis, layers having their magnetic moment in-plane and/or nonmagnetic layers. Sublayers having their easy axes in-plane may also be included as long as the layer 110 has a perpendicular-to-plane easy axis. The perpendicular magnetic layer 110 may have a thickness of up to ten nanometers. In some embodiments, this thickness is at least one nanometer and not more than two nanometers.

The second magnetic layer 130 has an out-of-plane demagnetization energy that exceeds its perpendicular magnetic anisotropy energy. In some embodiments, the perpendicular magnetic anisotropy energy may be significantly less than the out-of-plane demagnetization energy. The second magnetic layer 130 may have its easy axis 131 in-plane (along the y-axis as shown, along the x-axis, or some combination thereof). The second magnetic layer 130 may be termed an in-plane magnetic layer because of its magnetic anisotropy. In some embodiments, the in-plane magnetic layer may be a full-(i.e. a X2YZ) Heusler compound (or alloy) where X is selected from Mn, Fe, Co, Ni, Cu, Zn, Ru, Rh, Pd, Ag, Cd, Ir, Pt, Au, Gd, Tb, Dy, Ho, Er, Tm, Yb, and Lu; Y is selected from Ti, V, Cr, Mn, Fe, Y, Zr, Nb, Hf and Ta; and Z is selected from Al, Si, Ga, Ge, As, In, Sn, Sb, Pb and Bi. In some embodiments, the in-plane magnetic layer 130 is a half-(i.e. a XYZ) Heusler compound where X is selected from Mn, Fe, Co, Ni, Cu, Zn, Ru, Rh, Pd, Ag, Cd, Ir, Pt, Au, Gd, Tb, Dy, Ho, Er, Tm, Yb and Lu; Y is selected from Ti, V, Cr, Mn, Fe, Y, Zr, Nb, Hf and Ta; and Z is selected from Al, Si, Ga, Ge, As, In, Sn, Sb, Pb and Bi. In such embodiments, the magnetic layer 130 is a Heusler layer with an in-plane magnetization and a cubic structure, such as an $L2_1$ structure or a C1b structure. Such a magnetic layer may be termed an in-plane Heusler layer. For example, such an in-plane Heusler layer 130 may include at least one of $Co_2FeX$ and $Co_2MnY$, where X is selected from Ge, Si, Al, Sn and Ga and where Y is selected from Ge, Si, Sn, Ga and Al. In some embodiments, the in-plane Heusler layer may be a complex Heusler where X and/or Y and/or Z (referring to full- and half-Heuslers with composition X2YZ and XYZ, respectively) are combinations of elements (i.e. X may be a combination of Mn, Fe, Co, Ni, Cu, Zn, Ru, Rh, Pd, Ag, Cd, Ir, Pt, Au, Gd, Tb, Dy, Ho, Er, Tm, Yb, Lu and Y may be a combination of Ti, V, Cr, Mn, Fe, Y, Zr, Nb, Hf, Ta, and Z may be a combination of Al, Si, Ga, Ge, As, In, Sn, Sb, Pb, Bi). In some embodiments, the in-plane Heusler layer 130 is composed only of the in-plane Heusler alloy. For example, the in-plane Heusler layer 130 may consist of only $Co_2FeX$ or only $Co_2MnY$. However, in other embodiments, the in-plane Heusler layer 130 may include multiple sublayers and/or multiple materials. In some embodiments, each sublayer is an in-plane Heusler layer. In other embodiments, the sublayers may include other layers such as other materials having in-plane easy axes, other layers having their magnetic moments in-plane and/or nonmagnetic layers. Sublayers having their easy axes perpendicular-to-plane may also be included as long as the layer 130 has an in-plane easy axis. In still other embodiments, the magnetic layer 130 may not be a Heusler layer if the magnetic layer 130 includes/is a Heusler layer. The in-plane magnetic layer 130 may have a thickness of up to two nanometers. In some embodiments, this thickness is not more than one nanometer.

The amorphous layer 120 may be nonmagnetic or magnetic. The Heusler layers 110 and 130 are magnetically coupled. If the amorphous layer 120 is nonmagnetic, then the amorphous layer 120 is sufficiently thin that the layers 110 and 130 are ferromagnetically exchange coupled through the nonmagnetic amorphous layer 120. In some such embodiments, the nonmagnetic amorphous layer 120 is at least one Angstrom and not more than ten Angstroms thick. In some embodiments, the nonmagnetic amorphous layer 120 is at least two and not more than three Angstroms thick. For example, the amorphous layer 120 may be a Ta layer, a sputtered (amorphous) Si layer, and/or amorphous alloys of two or more materials from the second, third, fourth and fifth rows of the periodic table. For example, TiSi and AlNb may be used. In other embodiments, the amorphous layer 120 may be magnetic. In such embodiments, the amorphous layer 120 may be thicker than if the amorphous layer were magnetic because the amorphous layer 120 may not break the magnetic coupling between the Heusler layers 110 and 130. For example, the amorphous layer 120 may include Co, Ni and/or Fe alloyed with one or more materials from the second, third, fourth and fifth rows of the periodic table. Examples of such amorphous magnetic materials that may be used for the amorphous layer 120 include but are not limited to CoFeB, CoZr and FeAl. In such alloys the amorphizing elements (e.g. from the second, third, fourth and/or fifth rows of the periodic table) are present in sufficiently high quantities to prevent crystallization of the layer 120. In some embodiments, amorphizing elements (e.g. Si, Ge, Sn, Mg, O, Au, Xe, Ar, As, B, P) may be ion implanted into a magnetic or nonmagnetic material to create an amorphous layer.

The engineered Heusler structure 100 includes the perpendicular magnetic layer 110 having the perpendicular-to-plane easy axis 111, the in-plane layer 130 having the in-plane easy axis 131. One or both of the layers 110 and 130 may be a Heusler layer. In the discussions herein, the in-plane layer 130 is considered to be a Heusler layer while the perpendicular-to-plane layer 110 may or may not be a Heusler layer. The layers 110 and 130 are ferromagnetically coupled through the (magnetic or nonmagnetic) amorphous layer 120. The in-plane Heusler layer 130 also has lower magnetization than the perpendicular magnetic layer 110. Consequently, the easy axis of the engineered Heusler structure 102 is perpendicular to plane.

As indicated above, the engineered Heusler structure 100 has its easy axis 102 perpendicular to plane in a manner analogous to the perpendicular magnetic layer 110. By itself, the perpendicular magnetic layer 110 may have a lower tunneling magnetoresistance (TMR). However, the engineered Heusler structure 100 also includes in-plane Heusler layer 130. Consequently, the engineered Heusler structure 100 may also enjoy the benefits of the in-plane Heusler layer: higher magnetoresistance and lower damping. For example, since the majority spin band of the in-plane Heusler layer has metallic behavior while the minority spin band has semiconducting behavior such a material may be considered to be half-metallic and has a high spin polarization efficiency which is conducive to higher magnetoresistance. Use of the amorphous layer 120 may improve the quality of the in-plane Heusler layer 130 and thus the engineered Heusler structure 100. The in-plane Heusler layer 130 may be amorphous as deposited on the amorphous layer 120. After processing treatment, for example through annealing, the in-plane Heusler layer 130 may recrystallize with the desired crystal structure and chemical ordering, as well as with the desired crystallographic orientation. The magnetic properties, such as for high spin polarization, low damping and high magnetoresistance, may thus be present in the in-plane Heusler layer 130. Use of the amorphous layer 120 may also result in an improvement of the structure of the in-plane Heusler layer 130 over that which may be achieved if the in-plane Heusler layer 130 is deposited directly on the perpendicular magnetic layer 110. It is posited that this is because the amorphous layer lowers the activation energy of the in-plane Heusler layer to change from an amorphous state to the desired crystal structure (e.g. cubic/ $L2_1$) during the process treatment (e.g. high temperature annealing). However, the Heusler structure 100 is not dependent upon such an explanation.

The engineered Heusler structure 100 may allow the magnetic junction in which it is used to have improved performance. Because of the magnetic coupling between the perpendicular magnetic and in-plane magnetic/Heusler layers 110 and 130, the engineered Heusler structure has an easy axis 102 that is perpendicular-to-plane. Thus, the free layer and/or pinned layer in which the Heusler structure 100 is used may have the desired magnetic anisotropy. The magnetic junction using the engineered Heusler structure 100 may also have the improved magnetoresistance and reduced damping of the in-plane Heusler layer 130. Thus, a magnetic junction having the desired magnetic orientation, higher signal and moderate switching current for spin transfer torque (STT) switching may be achieved.

Figure 3:
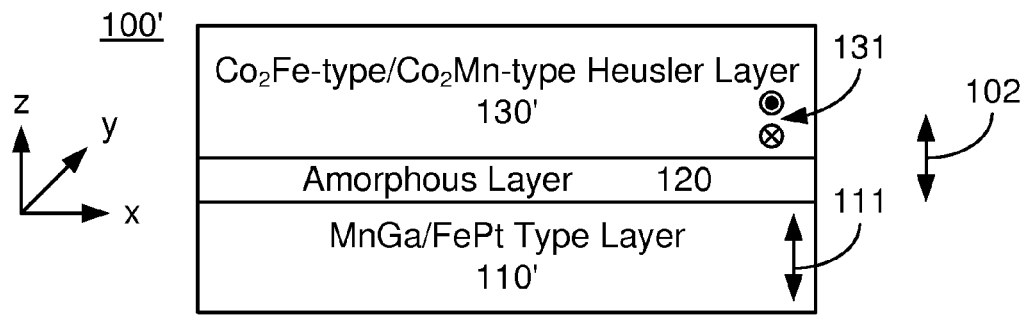
FIG. 3 depicts another exemplary embodiment of an engineered Heusler structure.

FIG. 3 depicts an exemplary embodiment of an engineered Heusler structure 100'. For clarity, FIG. 3 is not to scale and seed layer(s) on which the engineered Heusler structure 100' may be grown are not depicted. The engineered Heusler structure 100' is usable in a magnetic layer of a magnetic junction. For example, the Heusler structure 100' may be used in a free layer and/or a pinned layer of a magnetic junction. In some embodiments, multiple Heusler structures 100' may be used in a single free layer and/or a single pinned layer.

The Heusler structure 100' is analogous to the Heusler structure 100. Similar components thus have analogous labels. The Heusler structure 100' includes a magnetic layer 110', an amorphous layer 120 and a magnetic layer 130' that are analogous to the perpendicular magnetic layer 110, the amorphous layer 120 and the in-plane magnetic layer 130, respectively. The in-plane magnetic layer 130' may be a Heusler layer. Similarly, the perpendicular magnetic layer 110 may be a Heusler layer. As discussed herein, the in-plane magnetic layer 130' is considered to be a Heusler layer while the perpendicular magnetic layer 110 may not be. However, other configurations may be possible. The first magnetic layer 110' thus has a perpendicular-to-plane easy axis 111, while the Heusler layer 130' has an in-plane easy axis 131. The properties, such as magnetic characteristics, crystal structure and thickness, of the layers 110', 120 and 130' may be analogous to those of layers 110, 120 and 130, respectively. For example, the amorphous layer 120 may be nonmagnetic or magnetic.

The magnetic layer 110' has a perpendicular magnetic anisotropy energy that exceeds its out-of-plane demagnetization energy. In the embodiment shown, the magnetic layer explicitly has a $D0_{22}$ or $L1_0$ structure. Thus, the first Heusler layer 110' is a $Mn_{3-x}Ga/FePt/GaMn$ type perpendicular magnetic layer. In some embodiments, the first, perpendicular magnetic layer 110' may include multiple sublayers and/or multiple materials. In some embodiments, each sublayer is a $Mn_{3-x}Ga$, MnGa and/or FePt type magnetic alloy. In other embodiments, the sublayers may include other layers such as other materials having a perpendicular-to-plane easy axis, layers having their magnetic moment in-plane and/or nonmagnetic layers.

The Heusler layer 130' has an out-of-plane demagnetization energy that exceeds its perpendicular magnetic anisotropy energy. Although the easy axis 131 of the Heusler layer 130' is shown as along the y-axis, the direction of the easy axis may simply be in-plane (along the y-axis as shown, along the x-axis, or some combination thereof). The Heusler layer 130' is a $Co_2FeX/Co_2MnY$ type layer 130' (i.e. a full Heusler). The Heusler layer 130' thus has a cubic/$L2_1$ structure and may include $Co_2FeX$ and/or $Co_2MnY$. In some embodiments, the Heusler layer 130' may include multiple sublayers and/or multiple materials. In some embodiments, each sublayer is a $Co_2FeX/Co_2MnY$ type Heusler alloy. In other embodiments, the sublayers may include other layers such as other materials having in-plane easy axes and/or nonmagnetic layers. Sublayers having their easy axes perpendicular-to-plane may also be included as long as the layer 130 has an in-plane easy axis.

The engineered Heusler structure 100' includes the perpendicular magnetic layer 110' having the perpendicular-to-plane easy axis 111 and the in-plane Heusler layer 130' having the in-plane easy axis 131. The layers 110' and 130' are ferromagnetically coupled through the (magnetic or nonmagnetic) amorphous layer 120'. The in-plane Heusler layer 130' is also thinner than the perpendicular Heusler layer 110'. Consequently, the easy axis of the engineered Heusler structure 102 is perpendicular to plane.

The engineered Heusler structure 100' may share the benefits of the engineered Heusler structure 100. Similarly, a magnetic junction using the Heusler structure 100' may share the benefits of a junction using the engineered Heusler structure 100. The engineered Heusler structure 100' may allow the magnetic junction in which it is used to have improved performance. Because of the magnetic coupling between the Heusler layers 110' and 130', the engineered Heusler structure has an easy axis 102 that is perpendicular-to-plane. Thus, the free layer and/or pinned layer in which the Heusler structure 100' is used may have the desired magnetic anisotropy. The magnetic junction using the engineered Heusler structure 100' may also have the improved magnetoresistance and reduced damping of the in-plane Heusler layer 130'. Thus, a magnetic junction having the desired magnetic orientation, higher signal and moderate switching current for STT switching may be achieved.

Figure 4:
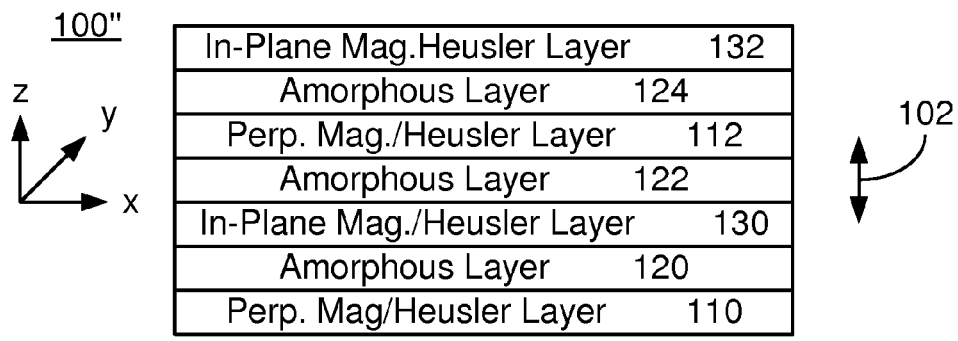
FIG. 4 depicts another exemplary embodiment of an engineered Heusler structure.

FIG. 4 depicts an exemplary embodiment of an engineered Heusler structure 100". For clarity, FIG. 4 is not to scale and seed layer(s) on which the engineered Heusler structure 100" may be grown are not depicted. The engineered Heusler structure 100" is usable in a magnetic layer of a magnetic junction. For example, the Heusler structure 100" may be used in a free layer and/or a pinned layer of a magnetic junction. In some embodiments, multiple Heusler structures 100" may be used in a single free layer and/or a single pinned layer.

The Heusler structure 100" is analogous to the Heusler structure 100 and/or 100'. Similar components thus have analogous labels. The Heusler structure 100" includes a magnetic layer 110, an amorphous layer 120 and a Heusler layer 130 that are analogous to the perpendicular magnetic layer 110/110', the amorphous layer 120 and the in-plane layers 130/130', respectively. The layer(s) 110 and/or 130 may thus be Heusler layer(s). For clarity, the easy axes of the layers 110 and 130 are not shown.

The engineered Heusler structure 100" may be considered to include multiple repeats of the Heusler structures 100/100' which are separated by amorphous layers. Thus, the Heusler structure 100" includes an additional perpendicular magnetic layer 112 and an additional in-plane magnetic layer 132 that sandwich an additional amorphous layer 124. The perpendicular magnetic layer 112 is also separated from the in-plane magnetic layer by amorphous layer 122. The perpendicular magnetic layer 112 and/or the in-plane magnetic layer 132 are Heusler layer(s). Additional repeats in which magnetic and Heusler layers are alternated with amorphous layers and in which the in-plane Heusler and perpendicular magnetic layers alternate may also be included. Thus, the engineered Heusler structure 100" still has a perpendicular-to-plane easy axis 102.

The engineered Hauser structure 100" may share the benefits of the engineered Heusler structure(s) 100/100'. Similarly, a magnetic junction using the Heusler structure 100" may share the benefits of a junction using the engineered Heusler structure(s) 100/100'. The engineered Heusler structure 100" may allow the magnetic junction in which it is used to have improved performance. Because of the magnetic coupling between the magnetic/Heusler layers 110 and 130, 130 and 112, and 112 and 132 the engineered Heusler structure 100" has an easy axis 102 that is perpendicular-to-plane. Thus, the free layer and/or pinned layer in which the Heusler structure 100" is used may have the desired magnetic anisotropy. The magnetic junction using the engineered Heusler structure 100" may also have the improved magnetoresistance and reduced damping of the in-plane Heusler layers 130 and 132. Thus, a magnetic junction having the desired magnetic orientation, higher signal and moderate switching current for STT switching may be achieved.

Figure 5:
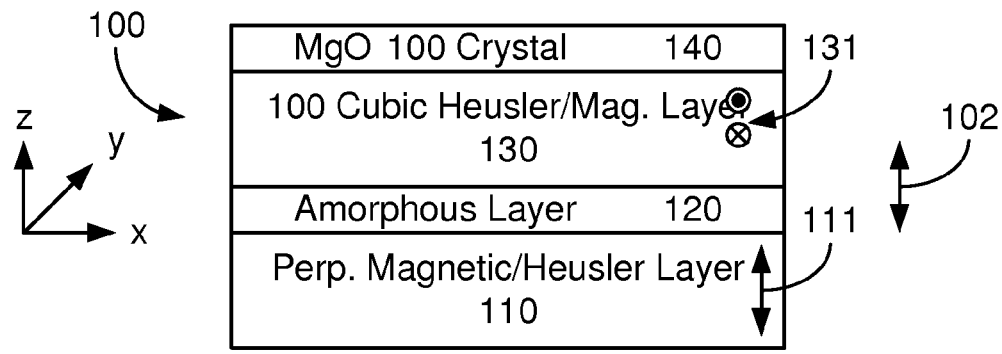
FIG. 5 depicts another exemplary embodiment of an engineered Heusler structure.

FIG. 5 depicts an exemplary embodiment of the engineered Heusler structure 100 in which another possible benefit is explained. For clarity, FIG. 5 is not to scale and seed layer(s) on which the engineered Heusler structure 100 may be grown are not depicted. The engineered Heusler structure 100 is usable in a magnetic layer of a magnetic junction. For example, the Heusler structure 100 may be used in a free layer and/or a pinned layer of a magnetic junction. In some embodiments, multiple Heusler structures 100 may be used in a single free layer and/or a single pinned layer.

The Heusler structure 100 depicted in FIG. 5 may be analogous to the Heusler structure(s) 100, 100' and/or 100". Similar components thus have analogous labels. The Heusler structure 100''' includes a magnetic layer 110, an amorphous layer 120 and a Heusler layer 130 that are analogous to the perpendicular magnetic layer 110/110', the amorphous layer 120 and the in-plane magnetic layer 130/130', respectively. One or both of the layers 110 and 130 are Heusler layers. Thus, the layers 110 and 130 are depicted as having easy axes 111 and 131, respectively.

The Heusler layer 130 is a cubic/L2$_1$ Heusler layer. In addition, a tunneling barrier layer 140 has been provided on the in-plane Heusler layer 130. The tunneling barrier layer 140 has a cubic crystal structure as discussed above. The orientation of the in-plane (cubic) Heusler layer 130 may also be 100. As a result, the layer 130 may provide a growth template for the desired 100 orientation of MgO. Consequently, a crystalline MgO barrier layer 140 having the desired orientation may be more readily grown. Thus, TMR may be enhanced.

Figure 6:
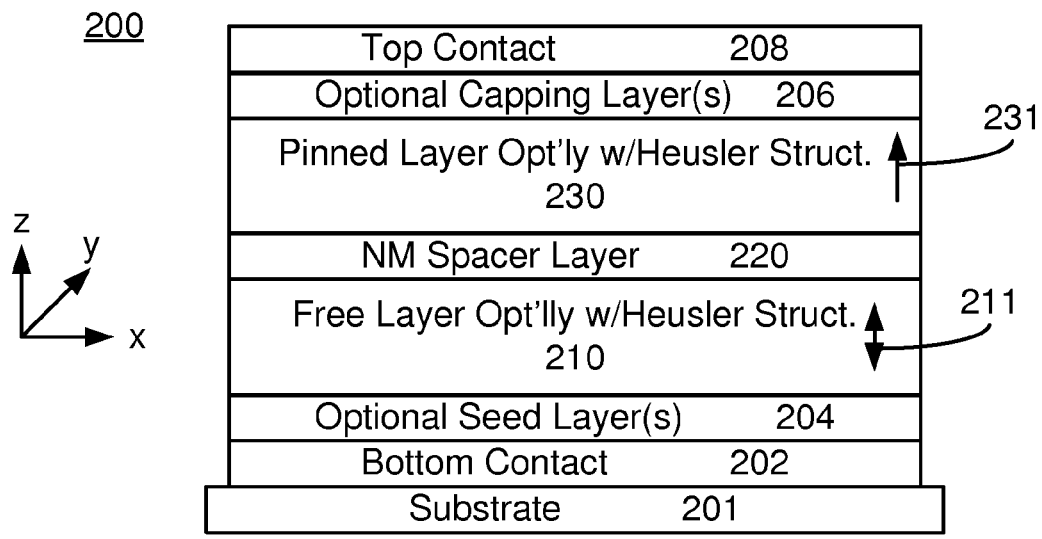
FIG. 6 depicts an exemplary embodiment of a magnetic junction including at least one engineered Heusler structure, usable in a magnetic memory programmable using spin transfer torque.

FIG. 6 depicts an exemplary embodiment of a magnetic junction 200 using at least one engineered Heusler structure and which is usable in a magnetic memory programmable utilizing spin transfer. For clarity, FIG. 6 is not to scale. The magnetic junction 200 may be used in a magnetic device such as a STT-RAM and, therefore, in a variety of electronic devices. The magnetic junction 200 includes a free layer 210 having magnetic moment 211, a nonmagnetic spacer layer 220, and a pinned layer 230 having magnetic moment 231. Also shown is an underlying substrate 201 in which devices including but not limited to a transistor may be formed. Bottom contact 202, top contact 208, optional seed layer(s) 204 and optional capping layer(s) 206 are also shown.

As can be seen in FIG. 6, the pinned layer 230 is closer to the top (furthest from a substrate 201) of the magnetic junction 200. However, in other embodiments, the pinned layer 230 may be closer to the substrate 201 than the free layer 210. An optional pinning layer (not shown) may be used to fix the magnetization (not shown) of the pinned layer 230. In some embodiments, the optional pinning layer may be an AFM layer or multilayer that pins the magnetization (not shown) of the pinned layer 230 by an exchange-bias interaction. However, in other embodiments, the optional pinning layer may be omitted or another structure may be used.

The magnetic junction 200 is also configured to allow the free layer 210 to be switched between stable magnetic states when a write current is passed through the magnetic junction 200. Thus, the free layer 210 is switchable utilizing spin transfer torque. In some embodiments, the switching is accomplished using only STT. However, in other embodiments, other mechanisms including but not limited to spin orbit torque and/or an applied field may also contribute to the switching.

The nonmagnetic spacer layer 220 may be an MgO tunneling barrier layer. The MgO layer may have a 200 orientation for enhanced tunneling magnetoresistance (TMR). However, in other embodiments, the nonmagnetic spacer layer 220 may be a conductor, such as Cu, or another insulating tunneling barrier layer. Other configurations, such as conductive channels in an insulating matrix, are also possible.

The pinned layer 230 and the free layer 210 are magnetic. In the embodiment shown, the perpendicular magnetic anisotropy of the free layer 210 exceeds its out-of-plane demagnetization energy. Similarly, the perpendicular magnetic anisotropy of the pinned layer 230 exceeds its out-of-plane demagnetization energy. Thus, the easy axis 211 of the free layer 210 and the magnetic moment 231 of the pinned layer 230 are shown as perpendicular-to-plane (in the z-direction). In other embodiments, one or both of the layers 210 and 230 might be in-plane.

The pinned layer 230 and/or the free layer 210 may be a multilayer. For example, the pinned layer 230 may be a SAF including multiple ferromagnetic layers interleaved with nonmagnetic layer(s). In such embodiments, the magnetic moments of the ferromagnetic layers maybe coupled antiparallel. Each ferromagnetic layer may also include sublayers including but not limited to multiple ferromagnetic layers. In other embodiments, the pinned layer 230 may be another multilayer. An optional pinning layer (not shown) may be used to fix the magnetization (not shown) of the pinned layer 230. Further, a polarization enhancement layer (PEL) having a high spin polarization and/or other layer(s) may be provided between the pinned layer 230 and the nonmagnetic spacer layer 220 and/or between the free layer 210 and the nonmagnetic spacer layer 220. However, in the embodiment shown, the free layer 210 and the pinned layer 230 each share an interface with the nonmagnetic spacer layer 220.

The free layer 210 and/or the pinned layer 230 includes an engineered Heusler structure such as the structures 100, 100' and/or 100". Thus, in one embodiment, only the free layer 210 includes the engineered Heusler structure(s) 100, 100' and/or 100". In another embodiment, only the pinned layer 230 includes the engineered Heusler structure(s) 100, 100' and/or 100". In still another embodiment, both the free layer 210 and the pinned layer 230 includes the engineered Heusler structure(s) 100, 100' and/or 100". The free layer 210 and/or the pinned layer 230 may consist only of the engineered Heusler structure(s) 100, 100' and/or 100". In other embodiments, the free layer 210 and/or the pinned layer 230 may include other sublayers.

The magnetic junction 200 may enjoy the benefits of the engineered Heusler structure(s) 100, 100' and/or 100". The Heusler structure(s) 100, 100' and/or 100" if used in the free layer 210 may provide the easy axis 211 that is perpendicular-to-plane. Similarly, the Heusler structure(s) 100, 100' and/or 100" in the pinned layer 230 may ensure that the magnetic moment 231 is perpendicular to plane. Thus, the free layer 210 and/or pinned layer 230 may have the desired magnetic anisotropy. The magnetic junction 200 may also have the improved magnetoresistance and reduced damping due to the in-plane Heusler layers of the Heusler structure(s) 100, 100' and/or 100" in the layer(s) 210 and/or 230. In addition, the nonmagnetic spacer layer 220 is grown on the free layer 210 in the embodiment shown. If the engineered Heusler structure(s) 100, 100' and/or 100" are used in the free layer 210 then the orientation of a crystalline MgO nonmagnetic spacer layer 220 may be improved. Thus, a magnetic junction having the desired magnetic orientation, higher signal and moderate switching current for STT switching may be achieved.

In some embodiments, the magnetic junction 200 may optionally include stress inducing capping and/or seed layers as layers 206 and/or 204, respectively. The perpendicular magnetic layer 110 of an engineered Heusler structure 100 may be used in the pinned layer and/or free layer (230 and/or 210, respectively) in the magnetic junction 200 with stress inducing capping and/or seed layers (206 and/or 204, respectively). In the present embodiment, an engineered Heusler structure may be configured such that the in-plane Heusler layer is adjacent to the non-magnetic spacer layer 220 and the perpendicular magnetic layer is adjacent to the capping layer 206 and/or the seed layer 204, depending on whether the engineered Heusler structure is used in the free layer 210, the pinned layer 230, or both. When adjacent to a stress inducing layer, the perpendicular magnetic layer may be a Heusler material such as those previously described. In the absence of a stress inducing layer, the Heusler material may have an in-plane magnetization. If adjacent to a stress inducing layer, the magnetization of the Heusler material may be perpendicular relative to the film plane. It is posited that when the cubic structure of a Heusler material is stressed such that the lattice is distorted to a tegragonal structure the magnetization may be made to be perpendicular rather than in-plane. However, the perpendicular Heusler layer of the present embodiment does not depend on such an explanation.

In some embodiments, the magnetic junction 200 may optionally include oxide capping and/or seed layers (206 and/or 204, respectively). The perpendicular magnetic layer 110 of an engineered Heusler structure 100 may be used in the pinned layer and/or free layer (230 and 210, respectively) in the magnetic junction 200 with oxide capping and/or seed layers (206 and 204, respectively). In the present embodiment, an engineered Heusler structure may be configured such that the in-plane Heusler layer is adjacent to the non-magnetic spacer layer 220 and the perpendicular magnetic layer is adjacent to the capping layer 206 and/or the seed layer 204, depending on whether the engineered Heusler structure is used in the free layer 210, the pinned layer 230, or both. If adjacent to an oxide layer, the perpendicular magnetic layer may be a Heusler material such as those previously described. In the absence of an oxide seed and/or cap layer, the Heusler material may have an in-plane magnetization. If adjacent to an oxide layer, the magnetization of the Heusler material may be perpendicular relative to the film plane. It is posited that when Heusler material is adjacent to an oxide material it is possible for the ferromagnetism carrying atoms to bond with oxygen atoms in the adjacent oxide material. The resulting oxygen bonds lead to interfacial perpendicular anisotropy. The magnetization may then be made to be perpendicular rather than in-plane. For example, if the Heusler material is Mn-based (e.g. the Mn atoms carry the ferromagnetic moment within the lattice), the Mn—O bond formed at the oxide interface may lead to interfacial perpendicular anisotropy. However, the perpendicular Heusler layer of the present embodiment does not depend on such an explanation.

Figure 7:
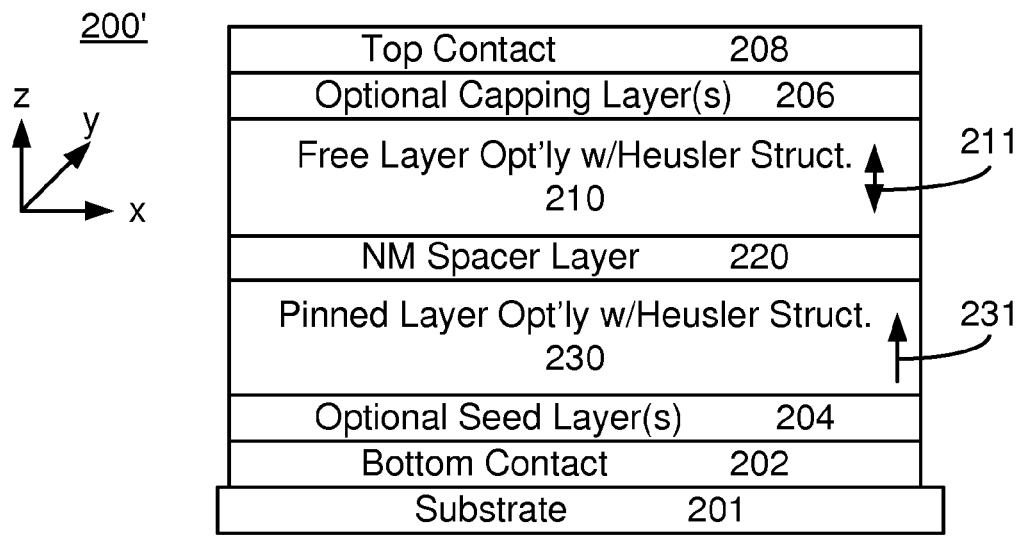
FIG. 7 depicts another exemplary embodiment of a magnetic junction including at least one engineered Heusler structure, usable in a magnetic memory programmable using spin transfer torque.

FIG. 7 depicts an exemplary embodiment of a magnetic junction 200' using at least one engineered Heusler structure and which is usable in a magnetic memory programmable utilizing spin transfer. For clarity, FIG. 7 is not to scale. The magnetic junction 200' may be used in a magnetic device such as a STT-RAM and, therefore, in a variety of electronic devices. The magnetic junction 200' is analogous to the magnetic junction 200. As a result, similar components have similar labels. The magnetic junction 200' includes a free layer 210 having magnetic moment 211, a nonmagnetic spacer layer 220, and a pinned layer 230 having magnetic moment 231 that are analogous to the free layer 210 having magnetic moment 211, the nonmagnetic spacer layer 220, and the pinned layer 230 having magnetic moment 231, respectively, depicted in FIG. 6. Also shown are an underlying substrate 201, bottom contact 202, top contact 208, optional seed layer(s) 204 and optional capping layer(s) 206 that are analogous to the substrate 201, bottom contact 202, top contact 208, optional seed layer(s) 204 and optional capping layer 206 shown in FIG. 6.

The magnetic junction 200' is also configured to allow the free layer 210 to be switched between stable magnetic states when a write current is passed through the magnetic junction 200'. Thus, the free layer 210 is switchable utilizing spin transfer torque. In some embodiments, the switching is accomplished using only STT. However, in other embodiments, other mechanisms including but not limited to spin orbit torque and/or an applied field may also contribute to the switching.

As can be seen in FIG. 7, the pinned layer 230 is now closer to the substrate 201 than the free layer 210. The nonmagnetic spacer layer 220 is thus provided on the pinned layer 210. The pinned layer 230 and the free layer 210 are magnetic and analogous to those in the magnetic junction 200. In the embodiment shown, the perpendicular magnetic anisotropy of the pinned layer 230 exceeds its out-of-plane demagnetization energy. Similarly, the perpendicular magnetic anisotropy of the free layer 210 exceeds its out-of-plane demagnetization energy. Thus, the easy axis 211 of the free layer 210 and the magnetic moment 231 of the pinned layer 230 are shown as perpendicular-to-plane (in the z-direction). In other embodiments, one or both of the layers 210 and 230 might be in-plane. The free layer 210 and/or the pinned layer 230 includes an engineered Heusler structure such as the structures 100, 100' and/or 100".

The magnetic junction 200' may enjoy the benefits of the engineered Heusler structure(s) 100, 100' and/or 100" as well as the magnetic junction 200. The Heusler structure(s) 100, 100' and/or 100" if used in the free layer 210 may provide the easy axis 211 that is perpendicular-to-plane. Similarly, the Heusler structure(s) 100, 100' and/or 100" in the pinned layer 230 may ensure that the magnetic moment 231 is perpendicular to plane. Thus, the free layer 210 and/or pinned layer 230 may have the desired magnetic anisotropy. The magnetic junction 200' may also have the improved magnetoresistance and reduced damping due to the in-plane Heusler layers of the Heusler structure(s) 100, 100' and/or 100" in the layer(s) 210 and/or 230. In addition, the nonmagnetic spacer layer 220 is grown on the pinned layer 230 in the embodiment shown. If the engineered Heusler structure(s) 100, 100' and/or 100" are used in the pinned layer 230 then the orientation of a crystalline MgO nonmagnetic spacer layer 220 may be improved. Thus, a magnetic junction having the desired magnetic orientation, higher signal and moderate switching current for STT switching may be achieved.

In some embodiments, the magnetic junction 200' may optionally include stress inducing capping and/or seed layers (206 and/or 204, respectively). The perpendicular magnetic layer 110 of an engineered Heusler structure 100 may be used in the pinned layer and/or free layer (230 and 210, respectively) in the magnetic junction 200' with stress inducing capping and/or seed layers (206 and/or 204, respectively). In the present embodiment, an engineered Heusler structure may be configured such that the in-plane Heusler layer is adjacent to the non-magnetic spacer layer 220 and the perpendicular magnetic layer is adjacent to the capping layer 206 and/or the seed layer 204, depending on whether the engineered Heusler structure is used in the free layer 210, the pinned layer 230, or both. When adjacent to a stress inducing layer, the perpendicular magnetic layer may be a Heusler material such as those previously described. In the absence of a stress inducing layer, the Heusler material may have an in-plane magnetization. If adjacent to a stress inducing layer, however, the magnetization of the Heusler material may be perpendicular relative to the film plane. It is posited that when the cubic structure of a Heusler material is stressed such that the lattice is distorted to a tegragonal structure the magnetization may be made to be perpendicular rather than in-plane. However, the perpendicular Heusler layer of the present embodiment does not depend on such an explanation.

In some embodiments, the magnetic junction 200' may optionally include oxide capping and/or seed layers (206 and/or 204, respectively). The perpendicular magnetic layer 110 of an engineered Heusler structure 100 may be used in the pinned layer and/or free layer (230 and 210, respectively) in the magnetic junction 200' with oxide capping and/or seed layers (206 and 204, respectively). In the present embodiment, an engineered Heusler structure may be configured such that the in-plane Heusler layer is adjacent to the non-magnetic spacer layer 220 and the perpendicular magnetic layer is adjacent to the capping layer 206 and/or the seed layer 204, depending on whether the engineered Heusler structure is used in the free layer 210, the pinned layer 230, or both. When adjacent to an oxide layer, the perpendicular magnetic layer may be a Heusler material such as those previously described. In the absence of an oxide seed and/or cap layer, the Heusler material may have an in-plane magnetization. When adjacent to an oxide layer, the magnetization of the Heusler material may be perpendicular relative to the film plane. It is posited that when Heusler material is adjacent to an oxide material it is possible for the ferromagnetism carrying atoms to bond with oxygen atoms in the adjacent oxide material, the resulting oxygen bond leading to interfacial perpendicular anisotropy, the magnetization may then be made to be perpendicular rather than in-plane. For example, if the Heusler material is Mn-based (i.e. the Mn atoms carry the ferromagnetic moment within the lattice), the Mn—O bond formed at the oxide interface may lead to interfacial perpendicular anisotropy. However, the perpendicular Heusler layer of the present embodiment does not depend on such an explanation.

Figure 8:
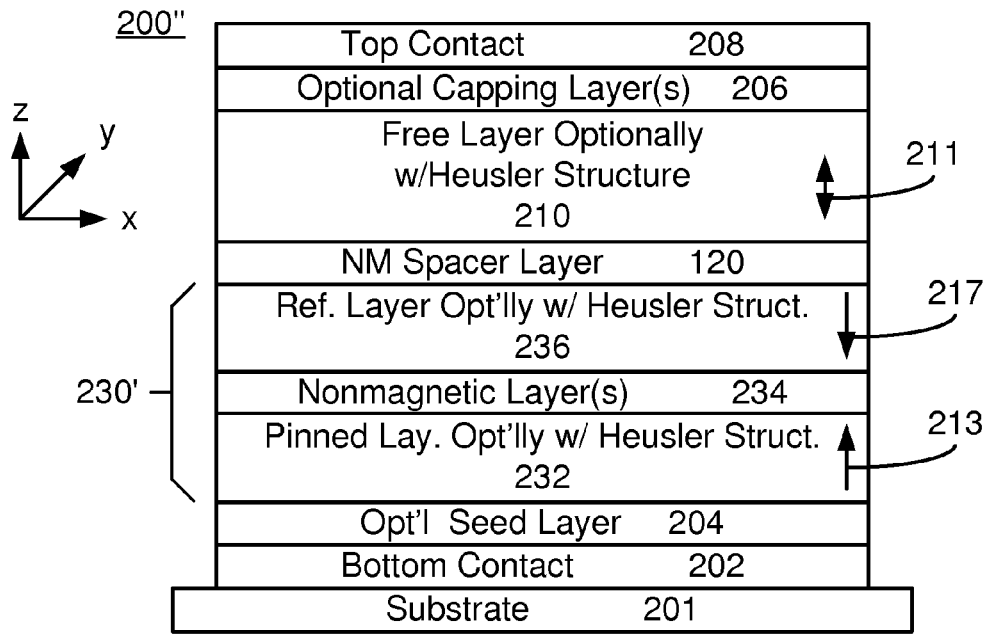
FIG. 8 depicts another exemplary embodiment of a magnetic junction including at least one engineered Heusler structure, usable in a magnetic memory programmable using spin transfer torque.

FIG. 8 depicts an exemplary embodiment of a magnetic junction 200" using at least one engineered Heusler structure and which is usable in a magnetic memory programmable utilizing spin transfer. For clarity, FIG. 8 is not to scale. The magnetic junction 200" may be used in a magnetic device such as a STT-RAM and, therefore, in a variety of electronic devices. The magnetic junction 200" is analogous to the magnetic junction 200 and/or 200'. As a result, similar components have similar labels. The magnetic junction 200" includes a free layer 210 having magnetic moment 211, a nonmagnetic spacer layer 220, and a pinned layer 230' that are analogous to the free layer 210 having magnetic moment 211, the nonmagnetic spacer layer 220, and the pinned layer 230 having magnetic moment 231, respectively, depicted in FIGS. 6-7. Also shown are an underlying substrate 201, bottom contact 202, top contact 208, optional seed layer(s) 204 and optional capping layer(s) 206 that are analogous to the substrate 201, bottom contact 202, top contact 208, optional seed layer(s) 204 and optional capping layer 206 shown in FIGS. 6-7.

The magnetic junction 200" is also configured to allow the free layer 210 to be switched between stable magnetic states when a write current is passed through the magnetic junction 200". Thus, the free layer 210 is switchable utilizing spin transfer torque. In some embodiments, the switching is accomplished using only STT. However, in other embodiments, other mechanisms including but not limited to spin orbit torque and/or an applied field may also contribute to the switching.

As can be seen in FIG. 8, the pinned layer 230' is closer to the substrate 201 than the free layer 210. The nonmagnetic spacer layer 220 is thus provided on the pinned layer 210' in the embodiment shown. In another embodiment, the free layer 210 might be closer to the substrate than the pinned layer 230'. In such an embodiment, the nonmagnetic spacer layer 220 may be grown on the free layer 210. The pinned layer 230' and the free layer 210 are magnetic and analogous to those in the magnetic junction(s) 200 and/or 200'. In the embodiment shown, the perpendicular magnetic anisotropy of the pinned layer 230' exceeds its out-of-plane demagnetization energy. Similarly, the perpendicular magnetic anisotropy of the free layer 210 exceeds its out-of-plane demagnetization energy. Thus, the easy axis 211 of the free layer 210 and the magnetic moment of the pinned layer 230 are shown as perpendicular-to-plane. In other embodiments, one or both of the layers 210 and 230 might be in-plane. The free layer 210 and/or the pinned layer 230 includes an engineered Heusler structure such as the structures 100, 100' and/or 100".

The pinned layer 230' is also a SAF. Thus, the pinned layer 230' includes ferromagnetic layers 232 and 236 interleaved with and separated by nonmagnetic layer 234. In such an embodiment, the ferromagnetic layer 232 has a magnetic moment 213 that may be pinned by a pinning layer (not shown) and is thus denoted as a pinned layer. The ferromagnetic layer 236 having magnetic moment 217 may be termed a reference layer. The pinned layer 232 and/or the reference layer 236 may include one or more engineered Heusler structure(s) 100, 100' and/or 100". The pinned layer 232 and/or the reference layer 236 may consist only of the engineered Heusler structure(s) 100, 100' and/or 100". In other embodiments, the pinned layer 232 and/or the reference layer may include other sublayer(s).

The magnetic junction 200" may enjoy the benefits of the engineered Heusler structure(s) 100, 100' and/or 100" as well as the magnetic junction 200 and/or 200'. The Heusler structure(s) 100, 100' and/or 100" if used in the free layer 210 may provide the easy axis 211 that is perpendicular-to-plane. Similarly, the Heusler structure(s) 100, 100' and/or 100" in the layers 232 and/or 236 of the pinned layer 230' may ensure that the magnetic moment 231 is perpendicular to plane. Thus, the free layer 210 and/or pinned layer 230 may have the desired magnetic anisotropy. The magnetic junction 200" may also have the improved magnetoresistance and reduced damping due to the in-plane Heusler layers of the Heusler structure(s) 100, 100' and/or 100" in the layer(s) 210 and/or 230'. In addition, the nonmagnetic spacer layer 220 is grown on the pinned layer 230' in the embodiment shown. If the engineered Heusler structure(s) 100, 100' and/or 100" are used in the pinned layer 230' then the orientation of a crystalline MgO nonmagnetic spacer layer 220 may be improved. Thus, a magnetic junction having the desired magnetic orientation, higher signal and moderate switching current for STT switching may be achieved.

Figure 9:
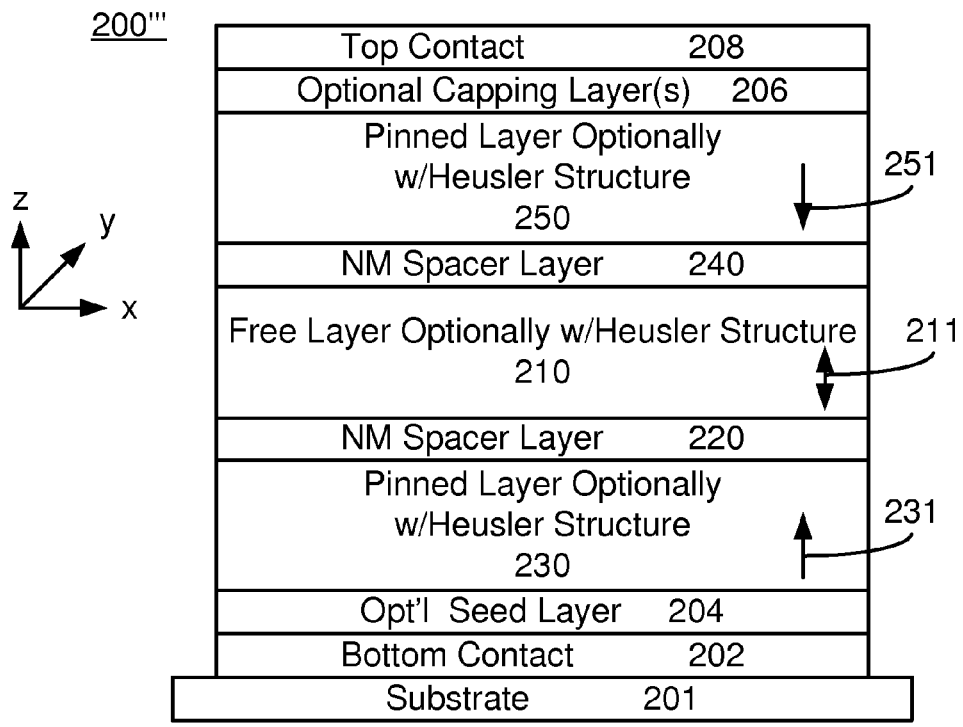
FIG. 9 depicts another exemplary embodiment of a magnetic junction including at least one engineered Heusler structure, usable in a magnetic memory programmable using spin transfer torque.

FIG. 9 depicts an exemplary embodiment of a magnetic junction 200''' using at least one engineered Heusler structure and which is usable in a magnetic memory programmable utilizing spin transfer. For clarity, FIG. 9 is not to scale. The magnetic junction 200''' may be used in a magnetic device such as a STT-RAM and, therefore, in a variety of electronic devices. The magnetic junction 200''' is analogous to the magnetic junction 200, 200' and/or 200". As a result, similar components have similar labels. The magnetic junction 200''' includes a free layer 210 having magnetic moment 211, a nonmagnetic spacer layer 220, and a pinned layer 230 that are analogous to the free layer 210 having magnetic moment 211, the nonmagnetic spacer layer 220, and the pinned layer 230/230' having magnetic moment 231, respectively, depicted in FIGS. 6-8. Also shown are an underlying substrate 201, bottom contact 202, top contact 208, optional seed layer(s) 204 and optional capping layer(s) 206 that are analogous to the substrate 201, bottom contact 202, top contact 208, optional seed layer(s) 204 and optional capping layer 206 shown in FIGS. 6-8.

The magnetic junction 200''' is also configured to allow the free layer 210 to be switched between stable magnetic states when a write current is passed through the magnetic junction 200'''. Thus, the free layer 210 is switchable utilizing spin transfer torque. In some embodiments, the switching is accomplished using only STT. However, in other embodiments, other mechanisms including but not limited to spin orbit torque and/or an applied field may also contribute to the switching.

As can be seen in FIG. 9, magnetic junction 200''' is a dual magnetic junction. Thus, the magnetic junction 200''' also includes an additional nonmagnetic spacer layer 240 and an additional pinned layer 250 that are analogous to the layers 220 and 230, respectively. In the embodiment shown, the magnetic moments 231 and 251 of the pinned layers 230 and 250 are aligned antiparallel (in a dual state). However, in other embodiments or another configuration, the magnetic moments 231 and 251 may be in the anti-dual state (parallel). The nonmagnetic spacer layer 240 may be a conductor, an insulating tunneling barrier layer such as crystalline MgO or may have another structure. The pinned layer 250 may optionally include one or more repeats of the engineered Heusler structures 100, 100' and/or 100". The perpendicular magnetic anisotropy of the pinned layer 250 exceeds its out-of-plane demagnetization energy. Thus, the magnetic moment of the pinned layer 250 is perpendicular-to-plane. In other embodiments, the magnetic moment of the pinned layer 250 might be in-plane. The pinned layer 250 may also be a SAF.

The magnetic junction 200''' may enjoy the benefits of the engineered Heusler structure(s) 100, 100' and/or 100" as well as the magnetic junction(s) 200, 200' and/or 200". The Heusler structure(s) 100, 100' and/or 100" if used in the free layer 210 may provide the easy axis 211 that is perpendicular-to-plane. Similarly, the Heusler structure(s) 100, 100' and/or 100" in the pinned layer 230 and/or the pinned layer 250 may ensure that the magnetic moment(s) 231 and/or 251 are perpendicular to plane. Thus, the free layer 210 and/or pinned layer(s) 230 and/or 250 may also have the desired magnetic anisotropy. The magnetic junction 200''' may also have the improved magnetoresistance and reduced damping due to the in-plane Heusler layers of the Heusler structure(s) 100, 100' and/or 100" in the layer(s) 210, 230 and/or 250. In addition, the nonmagnetic spacer layer(s) 220 and/or 240 are grown on the pinned layer 230 and/or free layer 210 in the embodiment shown. If the engineered Heusler structure(s) 100, 100' and/or 100" are used in the pinned layer 230 and/or the free layer 210 then the orientation of a crystalline MgO nonmagnetic spacer layer 220 and/or 240 may be improved. Thus, a magnetic junction having the desired magnetic orientation, higher signal and moderate switching current for STT switching may be achieved.

Figure 10:
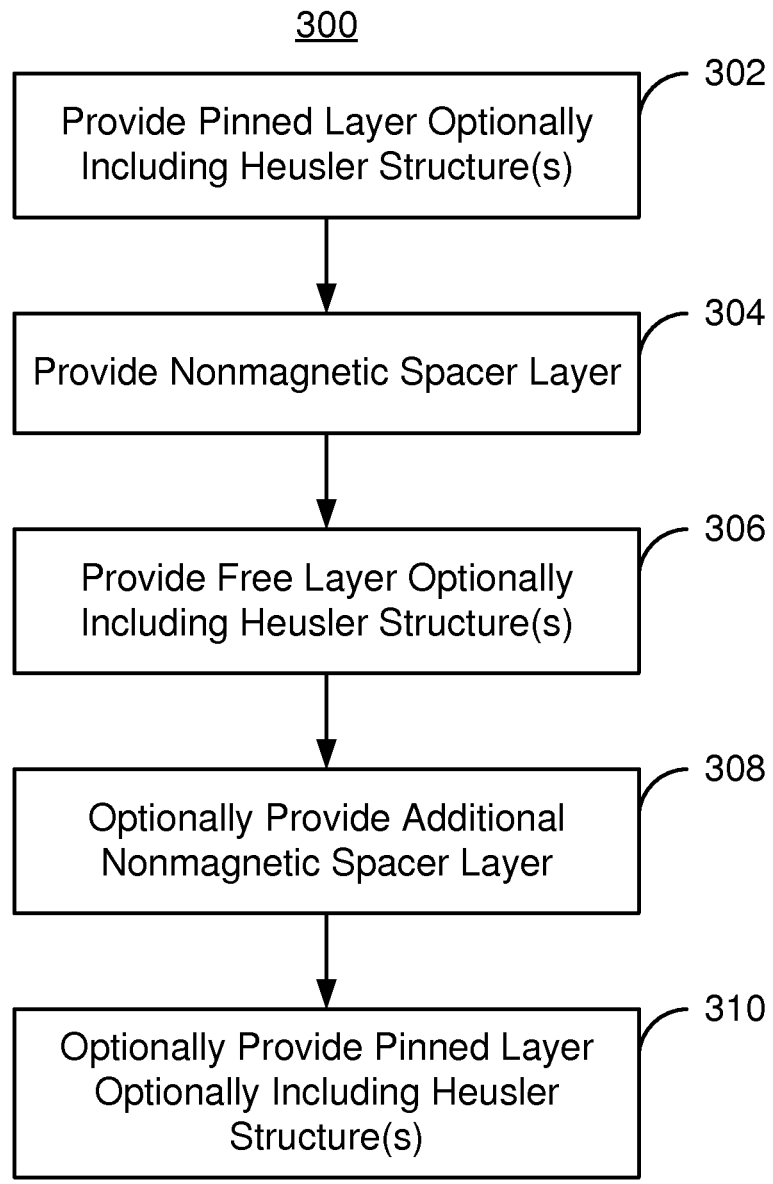
FIG. 10 is a flow chart depicting an exemplary embodiment of a method for providing a magnetic junction including at least one engineered Heusler structure usable in a magnetic memory programmable using spin transfer torque.

FIG. 10 depicts an exemplary embodiment of a method 300 for fabricating a magnetic junction including engineered Heusler structure(s) and usable in a magnetic device such as a spin transfer torque random access memory (STT-RAM) and, therefore, in a variety of electronic devices. For simplicity, some steps may be omitted, performed in another or combined. Further, the method 300 may start after other steps in forming a magnetic memory have been performed. For simplicity, the method 300 is described in the context of the magnetic junctions 200' and 200'''. However, other magnetic junctions may be formed.

A pinned layer 230 that may include an engineered Heusler structure(s) 100, 100', and/or 100" is provided on the substrate, via step 302. In some embodiments, step 302 includes depositing the material(s) for the pinned layer 230. Step 302 may also include annealing the pinned layer 230, or otherwise providing adequate energy for crystallization, in order to provide the desired crystallographic structure of the layer(s) in the Heusler structure(s) 100, 100' and/or 100". The edges of the pinned layer 230 may be defined at a later time, for example after deposition of the remaining layers of the magnetic junction.

A nonmagnetic spacer layer 220 is provided, via step 304. Step 304 may include depositing MgO, which forms a tunneling barrier layer. In some embodiments, step 304 may include depositing MgO using, for example, radio frequency (RF) sputtering. In other embodiments, metallic Mg may be deposited, then oxidized in step 304. As discussed above with respect to step 302, the edges of the nonmagnetic spacer layer 220 may be defined at a later time, for example after deposition of the remaining layers of the magnetic junction. In addition, the anneal step discussed above may be performed after deposition of the nonmagnetic spacer layer 220 in step 304.

A free layer 210 is provided, via step 306. In some embodiments, step 306 includes providing engineered Heusler structure(s) 100, 100' and/or 100" for the free layer 210. Thus, the nonmagnetic spacer layer 220 is between the pinned layer 230 and the free layer 210. As discussed above with respect to step 302, the edges of the pinned layer may be defined at a later time, for example after deposition of the remaining layers of the magnetic junction.

If a dual magnetic junction 200''' is to be provided, the additional nonmagnetic spacer layer 240 is provided, via step 308. Step 308 is analogous to step 304. In addition, annealing, or otherwise providing adequate energy for crystallization, may be performed for the spacer layer 240. This annealing and/or energy addition may also be used on the Heusler structure(s) of the free layer 210 provided in step 306.

If the dual magnetic junction 200''' is being fabricated, then the pinned layer 250 is provided, via step 310. Step 310 may include providing Heusler structure(s) 100, 100' and/or 100". Fabrication of the magnetic junction may be completed. For example, capping layers may be deposited and the edges of the magnetic junction defined.

Using the method 300, the magnetic junction 200, 200', 200" and/or 200''' may be formed. Thus, the benefits of the magnetic junction(s) 200, 200', 200" and/or 200''' may be achieved.

Figure 11:
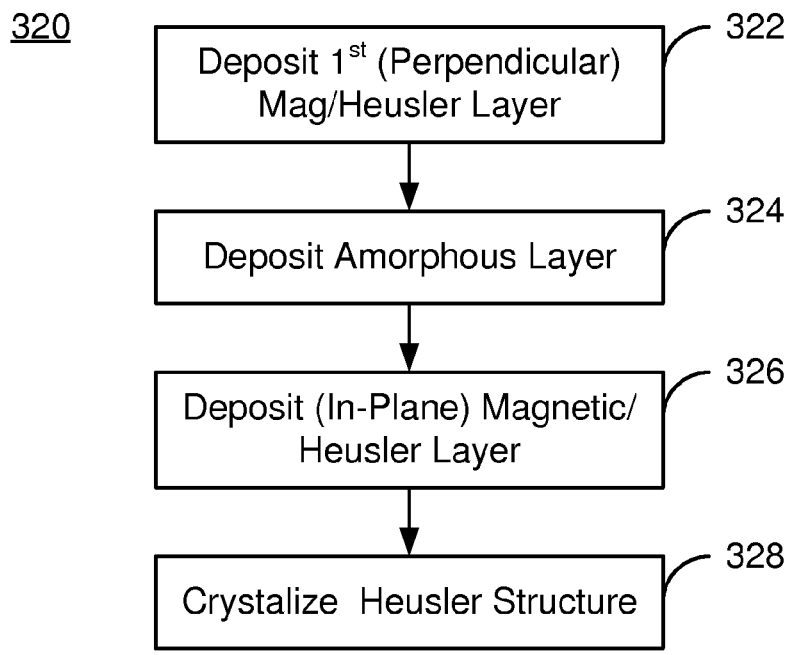
FIG. 11 is a flow chart depicting an exemplary embodiment of a method for providing an engineered Heusler structure usable in a magnetic memory programmable using spin transfer.

FIG. 11 depicts an exemplary embodiment of a method 320 for fabricating an engineered Heusler structure and usable in a magnetic device such as a STT-RAM and, therefore, in a variety of electronic devices. For simplicity, some steps may be omitted, performed in another or combined. Further, the method 320 may start after other steps in forming a magnetic memory have been performed. For simplicity, the method 320 is described in the context of the Heusler structure 100.

The first, perpendicular magnetic layer 110 is deposited, via step 322. Step 322 may include depositing the $D0_{22}$ and/or $L1_0$ magnetic alloys having a high perpendicular magnetic anisotropy.

The amorphous layer 120 is provided, via step 324. Step 324 may be performed by sputtering material(s) which are amorphous as-deposited. Step 324 may alternatively be performed by sputtering material(s) which are not amorphous as-deposited, then amorphizing the as-deposited material by, for example, ion implantation. However, other deposition methods may be used. Further, the amorphous materials deposited in step 324 may be magnetic or nonmagnetic.

The in-plane magnetic/Heusler layer 130 is deposited, via step 326. Step 326 may include depositing $L2_1$ Heusler alloys having an in-plane easy axis. Steps 322, 324 and 326 may be repeated so that a Heusler structure having multiple amorphous layers and multiple perpendicular and/or in-plane Heusler layers is provided with amorphous layers between each Heusler layer. For example, the engineered Heusler structure 100" may be deposited. The Heusler structure 100 is crystallized, for example through annealing or another method of introducing energy to the Heusler structure, via step 328. In some embodiments, step 328 may be performed after each in-plane Heusler layer 130 is deposited. In other embodiments, fewer anneals may be performed. For example, a single anneal may be performed after deposition of all of the layers in the engineered Heusler structure is completed. In some embodiments, high temperature annealing (e.g. rapid thermal annealing, single- or multi-step annealing, etc.) may be performed as part of the crystallization step 328. In some embodiments, ion beam irradiation may be performed during the crystallization step 328. When ion beam irradiation is performed for purposes of crystallization, the energy may be selected such that the activation energy for short range diffusion is acquired by the layer(s) to be crystallized (e.g. the in-plane Heusler layer). The energy of the ion beam may further be selected such that penetration into the engineered Heusler structure occurs up to a desired depth (e.g. up to at least the in-plane magnetic/Heusler layer and not including the amorphous layer). The energy of the ion beam may, for example, be less than 1.0 keV/atom and in an exemplary embodiment may be near 0.5 keV/atom. The ion beam may comprise charged and accelerated inert gaseous species such as Ne, Ar, Kr, Xe, or others. However, other species may be used. In addition, in some embodiments, energy may be added to the engineered Heusler structure 100 such that atoms within the engineered Heusler structure are allowed to diffuse a desired distance. This desired distance is dictated, at least in part, by the amount of energy added. The energy may be introduced into the engineered Heusler structure 100 using various process(es). Examples of such processes include but are not limited to annealing (as discussed above), radiation and exposure to accelerated particle beam(s).

Using the method 320 an engineered Heusler structure, such as the Heusler structure(s) 100, 100' and/or 100" may be provided. Thus, the benefits of such Heusler structures and magnetic junction(s) using such engineered Heusler structure(s) may be achieved.

Figure 12:
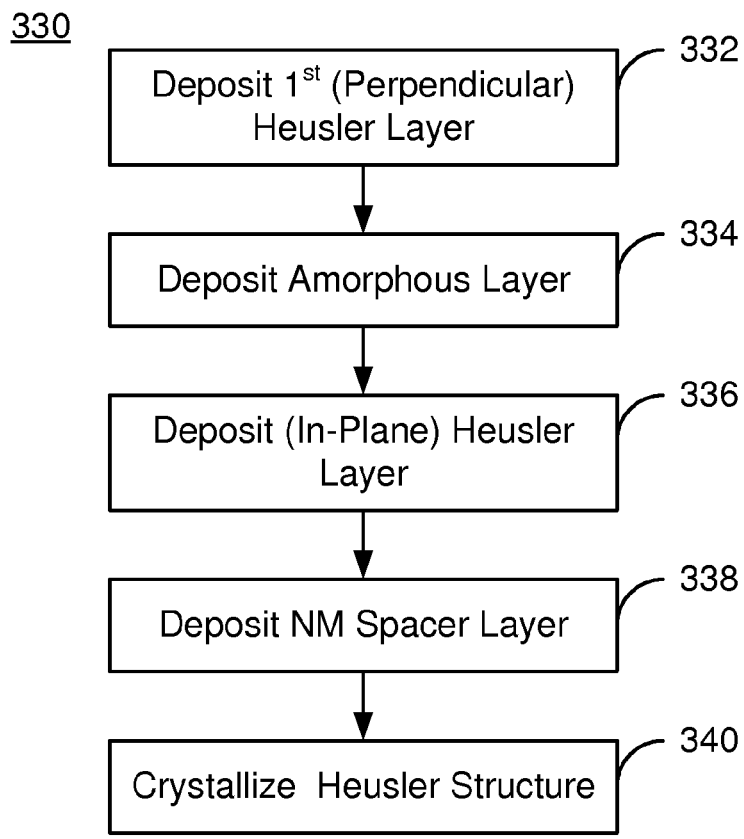
FIG. 12 is a flow chart depicting an exemplary embodiment of a method for providing an engineered Heusler structure usable in a magnetic memory programmable using spin transfer.

FIG. 12 depicts an exemplary embodiment of a method 330 for fabricating an engineered Heusler structure and usable in a magnetic device such as a STT-RAM and, therefore, in a variety of electronic devices. For simplicity, some steps may be omitted, performed in another or combined. Further, the method 330 may start after other steps in forming a magnetic memory have been performed. For simplicity, the method 330 is described in the context of the Heusler structure 100.

The first, perpendicular magnetic/Heusler layer 110 is deposited, via step 332. Step 332 may include depositing the $D0_{22}$ and/or $L1_0$ magnetic alloys having a high perpendicular magnetic anisotropy. Step 332 is thus analogous to step 322.

The amorphous layer 120 is provided, via step 334. Step 334 may be performed by sputtering material(s) which are amorphous as-deposited. However, other deposition methods may be used. Step 334 may alternatively be performed by sputtering material(s) which are not amorphous as-deposited, then amorphizing the as-deposited material by, for example, ion implantation. Further, the amorphous materials deposited in step 334 may be magnetic or nonmagnetic. Step 334 is thus analogous to step 324.

The in-plane magnetic/Heusler layer 130 is deposited, via step 336. Step 336 may include depositing L2$_1$ Heusler alloys having an in-plane easy axis. Steps 332, 334 and 336 may be repeated so that a Heusler structure having multiple amorphous layers and multiple perpendicular and/or in-plane Heusler layers is provided with amorphous layers between each Heusler layer. For example, the engineered Heusler structure 100" may be deposited.

A nonmagnetic spacer layer for the magnetic junction may be deposited, via step 338. For example, an MgO tunneling barrier layer may be deposited. Note that this step is part of formation of other portions of the magnetic junction rather than the engineered Heusler structure itself. The Heusler structure is crystallized, for example through annealing or another method of introducing energy to the Heusler structure, after deposition of the MgO tunneling barrier layer, via step 340. In some embodiments, step 340 may also be performed after each in-plane magnetic/Heusler layer 130 is deposited if multiple in-plane Heusler layers are formed. However, the last crystallization is generally performed after deposition of the tunneling barrier layer. In other embodiments, fewer crystallization steps may be performed. For example, a single crystallization step may be performed after deposition of all of the layers in the engineered Heusler structure is completed. Step 340 is thus analogous to step 328. In some embodiments, high temperature annealing (e.g. rapid thermal annealing, single- or multi-step annealing, etc.) may be performed during the crystallization step 340. In some embodiments, ion beam irradiation may be performed during the crystallization step 340. When ion beam irradiation is performed for purposes of crystallization the energy may be selected such that the activation energy for short range diffusion is acquired by the layer(s) to be crystallized (e.g. the in-plane Heusler layer). The energy of the ion beam may further be selected such that penetration into the engineered Heusler structure occurs up to a desired depth (e.g. up to at least the in-plane magnetic/Heusler layer and not including the amorphous layer). The energy of the ion beam may, for example, be less than 1.0 keV/atom and in an exemplary embodiment may be near 0.5 keV/atom. The ion beam may comprise charged and accelerated inert gaseous species such as Ne, Ar, Kr, Xe, or others. However, other species may be used.

In some embodiments, crystallization step 340 using ion beam irradiation may be performed following deposition of a non-magnetic spacer layer in step 338 (e.g. an MgO tunnel barrier layer) adjacent to the in-plane magnetic/Heusler layer. The energy level of the ion beam may be selected such that only the non-magnetic layer and adjacent in-plane magnetic/Heusler layer are allowed to crystallize. In a further embodiment, the ion beam may include oxygen which may, for example, compensate oxygen in the non-magnetic layer adjacent to the in-plane Heusler layer. Oxygen in the nonmagnetic layer may otherwise be lost (i.e. removed) by the ion beam. If, for example, the adjacent non-magnetic layer is MgO, the presence of oxygen in addition to Ne, Ar, Kr, or Xe in the ion beam may help to compensate oxygen that is removed from the MgO layer.

Using the method 330 an engineered Heusler structure, such as the Heusler structure(s) 100, 100' and/or 100" may be provided. In addition, the Heusler structure 100, 100' and/or 100" may be used as a seed layer/growth template for the tunneling barrier layer. Thus, the benefits of such Heusler structures and magnetic junction(s) using such engineered Heusler structure(s) may be achieved.

Figure 13:
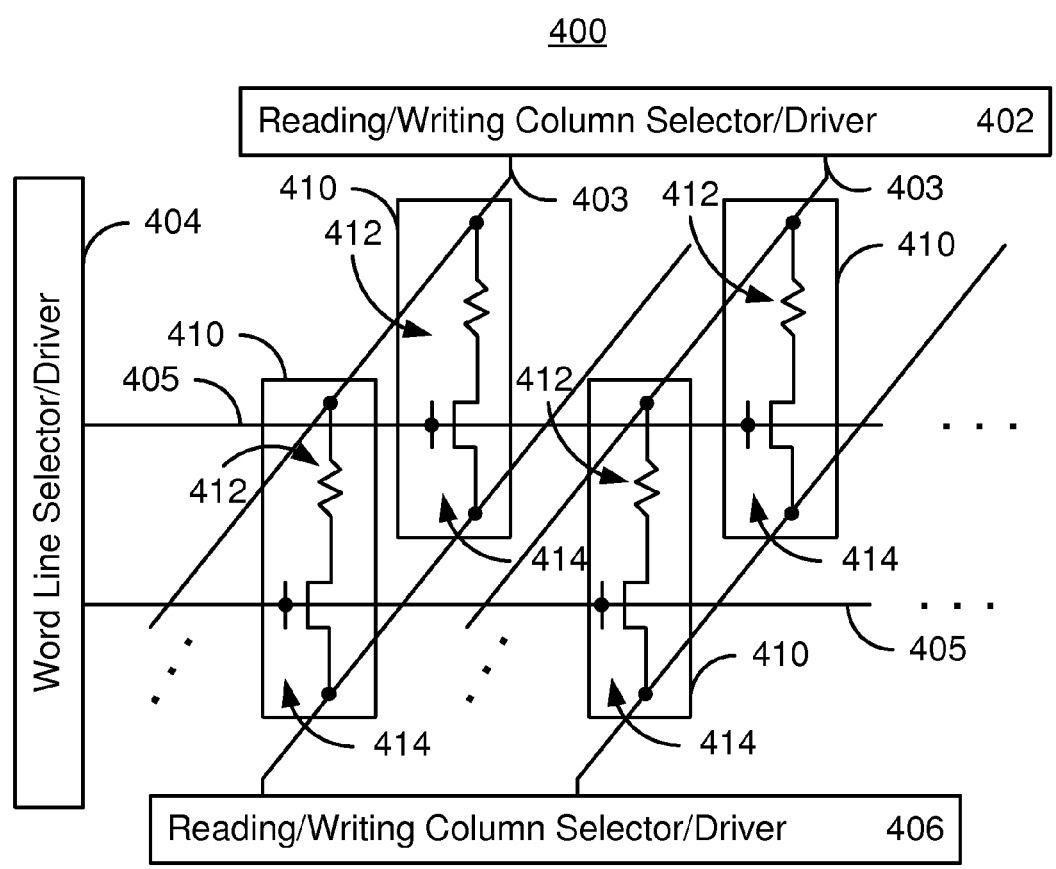
FIG. 13 depicts an exemplary embodiment of a memory utilizing magnetic junctions in the memory element(s) of the storage cell(s).

FIG. 13 depicts an exemplary embodiment of a memory 400 that may use one or more of the magnetic junctions 200, 200', 200" and/or 200'" as well as the engineered Heusler structure(s) 100, 100' and/or 100". The magnetic memory 400 includes reading/writing column select drivers 402 and 406 as well as word line select driver 404. Also shown are bit lines 403 and word lines 405. Note that other and/or different components may be provided. The storage region of the memory 400 includes magnetic storage cells 410. Each magnetic storage cell includes at least one magnetic junction 412 and at least one selection device 414. In some embodiments, the selection device 414 is a transistor. The magnetic junctions 412 may be one of the magnetic junctions 200, 200', 200" and/or 200'" disclosed herein. Although one magnetic junction 412 is shown per cell 410, in other embodiments, another number of magnetic junctions 412 may be provided per cell. As such, the magnetic memory 400 may enjoy the benefits described above.

A method and system for providing a magnetic junction and a memory fabricated using the magnetic junction has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic junction residing on a substrate and usable in a magnetic device comprising:

a free layer;

a nonmagnetic spacer layer; and a pinned layer, the nonmagnetic spacer layer residing between the pinned layer and the free layer, at least one of the free layer and the pinned layer including at least one engineered Heusler structure, each engineered Heusler structure including a first magnetic layer, a second magnetic layer and an amorphous layer between the first magnetic layer and the second magnetic layer, the first magnetic layer having a first perpendicular magnetic anisotropy energy and a first out-of-plane demagnetization energy, the first perpendicular magnetic anisotropy energy being greater than the first out-of-plane demagnetization energy, the second magnetic layer having a second perpendicular magnetic anisotropy energy and a second out-of plane demagnetization energy, the second perpendicular magnetic anisotropy energy being less than the second out-of-plane demagnetization energy, the at least one of the free layer and the pinned layer having a perpendicular magnetic anisotropy energy greater than an out-of-plane demagnetization energy;

wherein the magnetic junction is configured such that the free layer is switchable between a plurality of stable magnetic states when a write current is passed through the magnetic junction.

2. The magnetic junction of claim 1 wherein the amorphous layer is nonmagnetic and has a thickness, the thickness being sufficiently small that the first magnetic layer is exchange coupled with the second magnetic layer through the amorphous layer.

3. The magnetic junction of claim 1 wherein the amorphous layer is magnetic.

4. The magnetic junction of claim 1 wherein the amorphous layer is at least one of Si, Ge, Sn, Mg, O, Au, Xe, Ar, As, B, and P.

5. The magnetic junction of claim 1 wherein the first magnetic layer has a first thickness, the second magnetic layer has a second thickness, the first thickness and the second thickness not being more than ten nanometers.

6. The magnetic junction of claim 5 wherein the first thickness of the magnetic layer is not more than two nanometers and at least one nanometer.

7. The magnetic junction of claim 5 wherein the second thickness of the second magnetic layer is not more than one nanometer.

8. The magnetic junction of claim 1 wherein the first magnetic layer is at least one of a $D0_{22}$ structured magnetic material, an $L1_0$ structured magnetic material, and an $L1_1$ structured magnetic material, the $D0_{22}$ structured magnetic material including $Mn_xY_{1-x}$, where Y is selected from Ge, Sn, Ga, Al and Si, the $L1_0$ magnetic material including at least one of FePt and GaMn, the $L1_1$ magnetic material including at least one of FePt, FePd, CoPt, and MnAl.

9. The magnetic junction of claim 1 wherein the first magnetic layer is selected from a [CoX/Y]n multilayer, a CoZ layer, a CoZU layer and a rare earth transition metal alloy, wherein X is selected from Fe, Ni, and Cr, wherein Y is selected from Pt and Pd and wherein n is at least 1, wherein Z is selected from Fe, Ni and Cr, and U is selected from Pt and Pd, the rare earth transition metal alloy including at least one of SmCo5 and Fe14N.

10. The magnetic junction of claim 1 wherein the second magnetic layer is a cubic Heusler layer including at least one of $X_2YZ$ and XYZ, where X is selected from Mn, Fe, Co, Ni, Cu, Zn, Ru, Rh, Pd, Ag, Cd, Ir, Pt, Au, Gd, Tb, Dy, Ho, Er, Tm, Yb, and Lu and wherein Y is selected from Ti, V, Cr, Mn, Fe, Y, Zr, Nb, Hf, and Ta and wherein Z is selected from Al, Si, Ge, Ga, As, In, Sn, Sb, Pb, and Bi.

11. The magnetic junction of claim 1 wherein the second magnetic layer is a Heusler layer, the Heusler layer being a multilayer comprising at least one Heusler sub-layer.

12. The magnetic junction of claim 1 wherein the nonmagnetic spacer layer includes a tunneling barrier layer.

13. The magnetic junction of claim 1 further comprising:
an additional nonmagnetic spacer layer, the free layer being between the nonmagnetic spacer layer and the additional nonmagnetic spacer layer; and
an additional pinned layer, the additional nonmagnetic spacer layer being between the free layer and the additional pinned layer.

14. The magnetic junction of claim 1 wherein the pinned layer is a synthetic antiferromagnetic layer including a first ferromagnetic layer, a second ferromagnetic layer and a nonmagnetic layer between the first ferromagnetic layer and the second ferromagnetic layer.

15. The magnetic junction of claim 1 wherein the at least one engineered Heusler structure includes a first engineered Heusler structure and a second engineered Heusler structure, the free layer including the first engineered Heusler structure, the pinned layer including the second engineered Heusler structure.

16. A magnetic memory residing on a substrate, the magnetic memory comprising:
a plurality of magnetic storage cells, each of the plurality of magnetic storage cells including at least one magnetic junction, the at least one magnetic junction including a free layer, a nonmagnetic spacer layer and a pinned layer, the nonmagnetic spacer layer residing between the pinned layer and the free layer, at least one of the free layer and the pinned layer having at least one engineered Heusler structure, each engineered Heusler structure including a first magnetic layer, a second magnetic layer and an amorphous layer between the first magnetic layer and the second magnetic layer, the first magnetic layer having a first perpendicular magnetic anisotropy energy and a first out-of-plane demagnetization energy, the first perpendicular magnetic anisotropy energy being greater than the first out-of-plane demagnetization energy, the second magnetic layer having a second perpendicular magnetic anisotropy energy and a second out-of-plane demagnetization energy, the second perpendicular anisotropy energy being less than the second out-of-plane demagnetization energy, at least one of the first magnetic layer and the second magnetic layer being a Heusler layer, the at least one of the free layer and the pinned layer having a perpendicular magnetic anisotropy energy greater than an out-of-plane demagnetization energy, the magnetic junction being configured such that the free layer is switchable between a plurality of stable magnetic states when a write current is passed through the magnetic junction; and
a plurality of bit lines coupled with the plurality of magnetic storage cells.

17. The magnetic memory of claim 16 wherein the first magnetic layer is at least one of a $D0_{22}$ magnetic material, an $L1_0$ magnetic material, and an $L1_1$ magnetic material, the $D0_{22}$ magnetic material including $Mn_xU_{1-x}$, where U is selected from Ge, Sn, Ga, Al and Si, the $L1_0$ magnetic material including at least one of FePt and GaMn, the $L1_1$ magnetic material including at least one of FePt, FePd, CoPt, and MnAl and wherein the second magnetic layer is a cubic Heusler layer including at least one of $X_2YZ$ and XYZ, where X is selected from Mn, Fe, Co, Ni, Cu, Zn, Ru, Rh, Pd, Ag, Cd, Ir, Pt, Au, Gd, Tb, Dy, Ho, Er, Tm, Yb, and Lu and wherein Y is selected from Ti, V, Cr, Mn, Fe, Y, Zr, Nb, Hf, and Ta and wherein Z is selected from Al, Si, Ge, Ga, As, In, Sn, Sb, Pb, and Bi.

18. A method for providing a magnetic junction residing on a substrate and usable in a magnetic device, the method comprising:
providing a free layer;
providing a nonmagnetic spacer layer; and
providing a pinned layer, the nonmagnetic spacer layer residing between the pinned layer and the free layer, wherein at least one of the step of providing the free layer and the step of providing the pinned layer further includes:
providing at least one engineered Heusler structure, each engineered Heusler structure including a first magnetic layer, a second magnetic layer and an amorphous layer between the first magnetic layer and the second magnetic layer, at least one of the first magnetic layer and the second magnetic layer being a Heusler layer, the first magnetic layer having a first perpendicular magnetic anisotropy energy and a first out-of-plane demagnetization energy, the first perpendicular magnetic anisotropy energy being greater than the first out-of-plane demagnetization energy, the second magnetic layer having a second perpendicular magnetic anisotropy energy and a second out-of-plane demagnetization energy, the second perpendicular magnetic anisotropy energy being less than the second out-of-plane demagnetization energy, the at least one of the free layer and the pinned layer having a perpendicular magnetic anisotropy energy greater than an out-of-plane demagnetization energy, the magnetic junction being configured such that the free layer is switchable between a plurality of stable magnetic states when a write current is passed through the magnetic junction.

19. The method of claim 18 wherein the first magnetic layer is at least one of a $D0_{22}$ Heusler and an $L1_0$ Heusler, the $D0_{22}$ Heusler including $Mn_xY_{1-x}$ where Y is selected from Ge, Sn, Ga, Al and Si, the $L1_0$ Heusler including at least one of FePt and GaMn and wherein the second magnetic layer is a cubic Heusler material including at least one of $Co_2FeX$ and $Co_2MnY$, where X is selected from Ge, Si, Al, Sn and Ga and wherein Y is selected from Ge, Si, Sn, Ga and Al.

20. The method of claim 18 wherein the step of providing the at least one engineered Heusler structure further includes:
   crystallizing the at least one engineered Heusler structure.

21. The method of claim 20 wherein the step of crystallizing the at least one engineered Heusler structure comprises at least one of annealing and ion beam irradiation.

22. The method of claim 21 wherein the step of providing the at least one engineered Heusler structure is performed before the step of providing the nonmagnetic spacer layer and wherein the step of crystallizing the at least one engineered Heusler structure further includes:
   crystallizing the at least one Heusler structure before deposition of the material for the nonmagnetic spacer layer, the step of crystallizing the at least one engineered Heusler structure including at least one of annealing and ion beam radiation.

23. The method of claim 18 wherein the step of providing the at least one engineered Heusler structure further includes:
   providing the amorphous layer by depositing a material and amorphizing the material through ion implantation.

* * * * *